US008655466B2

(12) United States Patent
Moulios

(10) Patent No.: US 8,655,466 B2
(45) Date of Patent: Feb. 18, 2014

(54) CORRELATING CHANGES IN AUDIO

(75) Inventor: Chris Moulios, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 1187 days.

(21) Appl. No.: 12/544,141

(22) Filed: Aug. 19, 2009

(65) Prior Publication Data

US 2010/0222906 A1 Sep. 2, 2010

Related U.S. Application Data

(60) Provisional application No. 61/156,128, filed on Feb. 27, 2009.

(51) Int. Cl.
*G06F 17/00* (2006.01)
*H03G 3/00* (2006.01)

(52) U.S. Cl.
USPC ............................................... 700/94; 381/61

(58) Field of Classification Search
USPC ............................................... 700/94; 381/61
See application file for complete search history.

(56) References Cited

U.S. PATENT DOCUMENTS

| | | | | |
|---|---|---|---|---|
| 5,749,064 A * | 5/1998 | Pawate et al. | 704/213 |
| 5,842,172 A * | 11/1998 | Wilson | 704/503 |
| 6,175,632 B1 * | 1/2001 | Marx | 381/56 |
| 6,232,540 B1 * | 5/2001 | Kondo | 84/612 |
| 6,718,309 B1 * | 4/2004 | Selly | 704/503 |
| 6,835,885 B1 * | 12/2004 | Kondo et al. | 84/612 |
| 7,518,053 B1 * | 4/2009 | Jochelson et al. | 84/609 |
| 2004/0254660 A1 * | 12/2004 | Seefeldt | 700/94 |
| 2006/0107822 A1 * | 5/2006 | Bowen | 84/612 |
| 2009/0024234 A1 * | 1/2009 | Archibald | 700/94 |

OTHER PUBLICATIONS

Looper's Delight website at http://www.loopers-delight.com/loop.html (1996-present).
"KT Tunstall live at Apple keynote," video available at http://www.youtube.com/watch?v=qUwHQx3WgPU (Sep. 2007).
"Solo Jam # 2. Cajon, synth, guitars, Boss RC-50," video available at http://www.youtube.com/watch?v=c8YU_1NHmlM (Aug. 2007).
"Live Loop on an Echoplex Digital Pro," video available at http://www.youtube.com/watch?v=kCbKWOyI6UQ (Mar. 2008).
"2880(super multi-track looper)—Demo by Dan Miller," video available at http://www.youtube.com/watch?v=oOz8PtQ1FGA (Feb. 2009).
"Kid Beyond "Deep Inside" the John Lennon Educational Tour Bus," video available at http://www.youtube.com/watch?v=RkJz0OAowdk (Jun. 2006).
"'Na Na Na' by Theresa Andersson," video available at http://wwww.youtube.com/watch?v=n2eD4GcLohE (Jun. 2008).

* cited by examiner

*Primary Examiner* — Davetta W Goins
*Assistant Examiner* — Daniel Sellers
(74) *Attorney, Agent, or Firm* — Kilpatrick Townsend & Stockton LLP

(57) ABSTRACT

Exemplary embodiments of methods and apparatuses to correlate changes in one audio signal to another audio signal are described. A first audio signal is outputted. A second audio signal is received. The second audio signal may be stored in a memory buffer. The first audio signal is correlated to conform to the second audio signal. The first audio signal may be dynamically correlated to match with the second audio signal while the second audio signal is received. At least in some embodiments, a size of a musical time unit of the second audio signal is determined to correlate the first audio signal. At least in some embodiments, the adjusted first audio signal is stored in another memory buffer.

41 Claims, 7 Drawing Sheets

CORRELATING CHANGES IN AUDIO

PRIORITY

This application claims the benefit of prior U.S. Provisional Patent Application No. 61/156,128 entitled "Correlating Changes in Audio," filed Feb. 27, 2009, which is hereby incorporated by reference.

FIELD OF INVENTION

At least some embodiments of the present invention relate generally to audio signal processing, and more particularly, to correlating audio signals.

BACKGROUND

Audio signal processing, sometimes referred to as audio processing, is the processing of a representation of auditory signals, or sound. The audio signals, or sound may be in digital or in analog data format. The analog data format is normally electrical, wherein a voltage level represents the air pressure waveform of the sound. A digital data format expresses the air pressure waveform as a sequence of symbols, usually binary numbers. The audio signals presented in analog or in digital format may be processed for various purposes, for example, to correct timing of the audio signals.

Currently, audio signals may be generated and modified using a computer. For example, sound recordings or synthesized sounds may be combined and altered as desired to create standalone audio performances, soundtracks for movies, voiceovers, special effects, etc. To synchronize stored sounds, including music audio, with other sounds or with visual media, it is often necessary to alter the tempo (i.e.; playback speed) of one or more sounds.

Generally, a loop in audio processing may refer to a finite element of sound which is repeated using, for example, technical means. Loops may be repeated through the use of tape loops, delay effects, cutting between two record players, or with the aid of computer software. Many musicians may use digital hardware and software devices to create and modify loops, often in conjunction with various electronic musical effects. Live looping is generally referred to recording and playback of looped audio samples in real-time, using either hardware (magnetic tape or dedicated hardware devices) or software. A user typically determines the duration of the recorded musical piece to set the length of a loop. The speed or tempo of playing of the musical piece may define the speed of the loop. The recorded piece of music is typically played in the loop at a constant reference tempo. New musical pieces can be recorded subsequently on top of the previously recorded musical pieces played at a tempo of the reference loop.

Because the tempo and/or speed of recording of the new musical pieces may change, the loops of the newly recorded musical pieces may be non-synchronized to each other. The lack of synchronization between the musical pieces can severely impact a listening experience. Therefore, after being recorded, the tempo of the new musical pieces may be changed to the constant reference tempo of the previously recorded musical piece played in the reference loop.

Unfortunately, merely changing the tempo of all newly recorded musical pieces to a constant reference tempo may result in undesired audible side effects such as pitch variation (e.g., the "chipmunk" effect of playing a sound faster) and clicks and pops caused by skips in data as the tempo of the newly recorded pieces is changed. Currently there are no ways to dynamically adjust the tempo of the musical pieces during recording.

SUMMARY OF THE DESCRIPTION

Exemplary embodiments of methods, apparatuses, and systems to correlate changes in one audio signal to another audio signal are described. In one embodiment, a first audio signal is outputted, and a second audio signal is received. The second audio signal may be stored in a memory buffer. The first audio signal is correlated to conform to changes in the second audio signal. The first audio signal may be dynamically correlated to match with the second audio signal while the second audio signal is received. At least in some embodiments, a size of a musical time unit of the second audio signal is determined to correlate the first audio signal. At least in some embodiments, the adjusted first audio signal is stored in another memory buffer.

At least in some embodiments, correlating the first audio signal may include time stretching the first audio signal, time compressing the first audio signal, or both. In some embodiments, correlating the first audio signal includes adjusting a tempo of the first audio signal to the tempo of the second audio signal.

At least in some embodiments, a first audio signal is outputted, and a second audio signal is received. For example, the first audio signal may be played back, generated, or both. Data of the second audio signal may be stored in a memory buffer. The data of first audio signal may be dynamically correlated to conform to the changes in the second audio signal while the second audio signal is received. Further, a third audio signal may be received. The third audio signal may be stored in another memory buffer. At least the second audio signal may be adjusted to conform to the third audio signal.

At least in some embodiments, a first audio signal is outputted while a second audio signal is received. The data of the second audio signal may be stored in a memory buffer. Further, a determination is made whether to commit data of the second audio signal to mix with the data of the first audio signal. The data of the first audio signal is dynamically correlated to match with the data of the second audio signal if the data of the second audio signal is committed to mix with the data of the first audio signal.

At least in some embodiments, a new audio signal is received. The new audio signal is stored in a memory buffer. A size of a musical unit of the new audio signal may be determined. The musical time unit may be, for example, a beat, a measure, a bar, or any other musical time unit. The size of the musical unit of a recorded audio signal is adjusted to the size of the musical unit of the new audio signal. At least in some embodiments, the new audio signal may be grouped with one or more previously recorded audio signals.

At least in some embodiments, a new audio signal is received. The new audio signal is stored in a memory buffer. A size of a musical unit of the new audio signal may be determined. The size of the musical unit may be determined based on a tempo of the new audio signal. The size of the musical unit may include a time value. The size of the musical unit of a recorded audio signal is adjusted to the size of the musical unit of the new audio signal.

At least in some embodiments, a determination is made whether to commit data of the new audio signal to mix with the data of the recorded audio signal. The size of the musical unit of a recorded audio signal is adjusted to the size of the musical unit of the new audio signal when the data of the new audio signal are committed to mix with the data of the recorded audio signal.

At least in some embodiments, adjusting data of the recorded audio signal to the data of the new audio signal comprises time stretching data of the recorded audio signal to match the size of the musical unit of the new audio signal, time compressing data of the recorded audio signal to match the size of the musical unit of the new audio signal, or both. At least in some embodiments, the recorded audio signal is faded out after being correlated to changes in the new audio signal.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
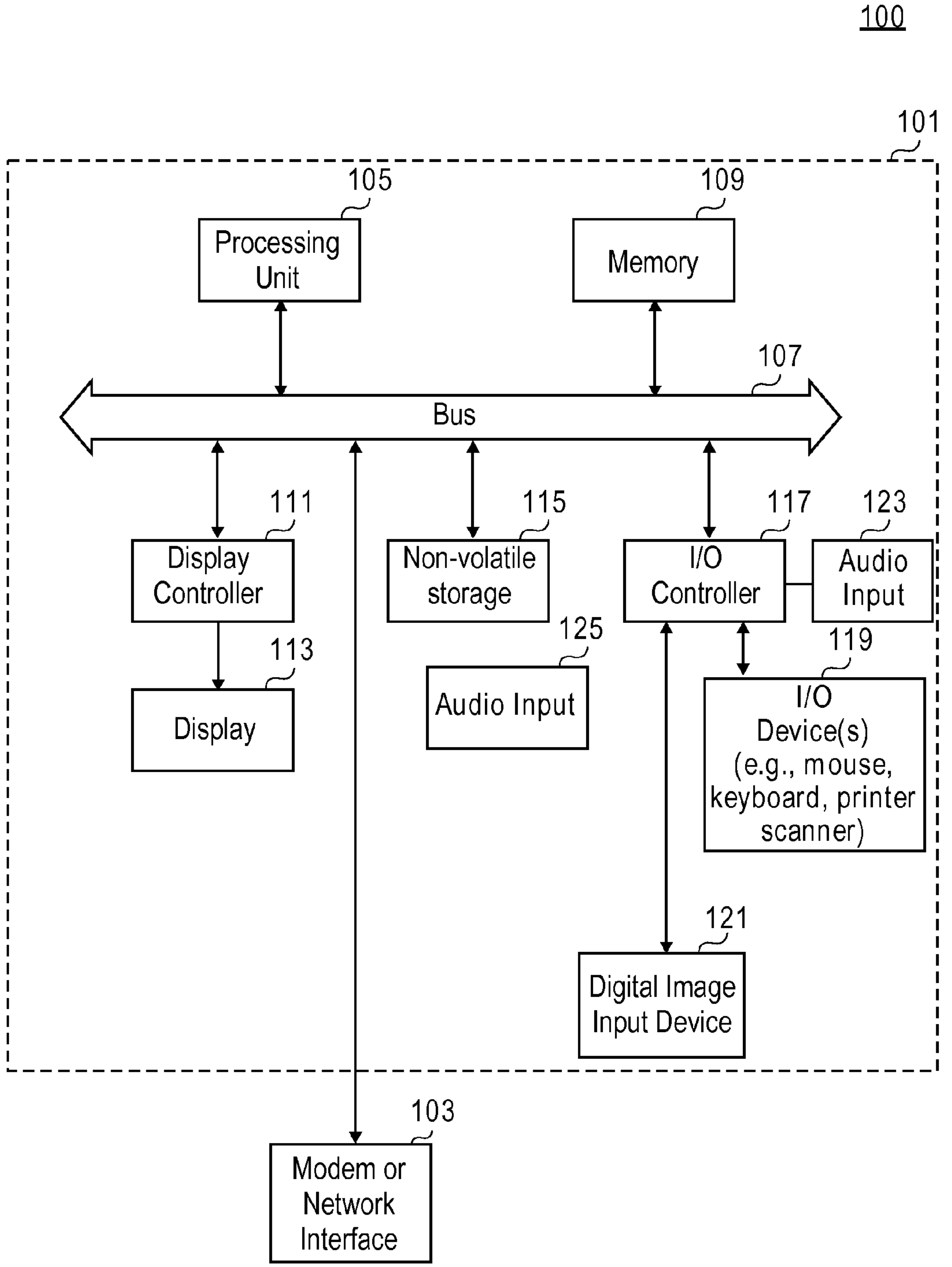
FIG. 1 is a view of an exemplary data processing system which may be used the embodiments of the present invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. Copyright© Apple, 2009, All Rights Reserved.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily refer to the same embodiment.

Unless specifically stated otherwise, it is appreciated that throughout the description, discussions utilizing terms such as "processing" or "computing" or "calculating" or "determining" or "displaying" or the like, refer to the action and processes of a data processing system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention can relate to an apparatus for performing one or more of the operations described herein. This apparatus may be specially constructed for the required purposes, or it may comprise a general purpose computer selectively activated or reconfigured by a computer program stored in the computer. Such a computer program may be stored in a machine (e.g., computer) readable storage medium, such as, but is not limited to, any type of disk, including floppy disks, optical disks, CD-ROMs, and magnetic-optical disks, read-only memories (ROMs), random access memories (RAMs), erasable programmable ROMs (EPROMs), electrically erasable programmable ROMs (EEPROMs), magnetic or optical cards, or any type of media suitable for storing electronic instructions, and each coupled to a bus.

The algorithms and displays presented herein are not inherently related to any particular computer or other apparatus. Various general-purpose systems may be used with programs in accordance with the teachings herein, or it may prove convenient to construct more specialized apparatus to perform the required machine-implemented method operations. The required structure for a variety of these systems will appear from the description below.

In addition, embodiments of the present invention are not described with reference to any particular programming language. It will be appreciated that a variety of programming languages may be used to implement the teachings of embodiments of the invention as described herein.

Exemplary embodiments of methods, apparatuses, and systems to correlate changes in audio signals are described. More specifically, the embodiments are directed towards methods, apparatuses, and systems for recording new audio while playing back existing audio. The system may output, for example, generate, and/or playback a first audio signal while receiving a second (new) audio signal. The newly recorded audio signal and the first audio signal may be correlated, such that the existing first audio signal matches the tempo changes of the new audio signal. The new audio signal may be stored in a memory buffer. The first audio signal is correlated to conform to changes in the second audio signal. The first audio signal may be dynamically correlated to match with the second audio signal while the second audio signal is received.

At least in some embodiments, a size of a musical time unit of the second audio signal is determined to correlate the first audio signal. At least in some embodiments, the adjusted first audio signal is stored in another memory buffer. Embodiments of the invention operate to maintain the record buffer playing back at a correct synchronization and pitch when the tempo of the newly recorded audio is changed, so as if the tape speeds up and slows down along with a master clock, as set forth in further detail below. That is, the embodiments of the invention operate on preserving the sound quality while keeping the most recent performances as free of time stretching/time compressing as possible, as described in further details below.

FIG. 1 is a view 100 of an exemplary data processing system which may be used the embodiments of the present invention. Note that while FIG. 1 illustrates various components of a data processing system, it is not intended to represent any particular architecture or manner of interconnecting the components as such details are not germane to the present invention. It will also be appreciated that network computers and other data processing systems or consumer electronic products which have fewer components or perhaps more components may also be used with the present invention. The data processing system of FIG. 1 may, for example, be an Apple Macintosh® computer.

As shown in FIG. 1, the data processing system 101, which is a form of a data processing system, includes a bus 107 which is coupled to a processing unit 105 (e.g., a microprocessor, and/or a microcontroller) and a memory 109. The processing unit 105 may be, for example, an Intel Pentium microprocessor, or Motorola Power PC microprocessor, such as a G3 or G4 microprocessors, or IBM microprocessor. The data processing system 101 interfaces to external systems through the modem or network interface 103. It will be appreciated that the modem or network interface 103 can be considered to be part of the data processing system 101. This interface 103 can be an analog modem, ISDN modem, cable modem, token ring interface, satellite transmission interface, or other interfaces for coupling a data processing system to other data processing systems.

Memory 109 can be dynamic random access memory (DRAM) and can also include static RAM (SRAM). Memory 109 may include one or more memory buffers, as described in further detail below. The bus 107 couples the processor 105 to the memory 109 and also to non-volatile storage 115 and to display controller 111 and to the input/output (I/O) controller 117. The display controller 111 controls in the conventional manner a display on a display device 113 which can be a cathode ray tube (CRT) or liquid crystal display (LCD). The I/O controller 117 is coupled to one or more audio input devices 125, for example, one or more microphones, to receive audio signals.

As shown in FIG. 1, I/O controller 117 is coupled to one or more audio output devices 123, for example, one or more speakers. The input/output devices 119 can include a keyboard, disk drives, printers, a scanner, and other input and output devices, including a mouse or other pointing device. In one embodiment, I/O controller 117 includes a USB (Universal Serial Bus) adapter for controlling USB peripherals, and/or an IEEE-1394 bus adapter for controlling IEEE-1394 peripherals.

The display controller 111 and the I/O controller 117 can be implemented with conventional well known technology. A digital image input device 121 can be a digital camera which is coupled to an I/O controller 117 in order to allow images from the digital camera to be input into the data processing system 101. The non-volatile storage 115 is often a magnetic hard disk, an optical disk, or another form of storage for large amounts of data. Some of this data is often written, by a direct memory access process, into memory 109 during execution of software in the data processing system 101. One of skill in the art will immediately recognize that the terms "computer-readable medium" and "machine-readable medium" include any type of storage device that is accessible by the processor 105.

It will be appreciated that the data processing system 101 is one example of many possible data processing systems which have different architectures. For example, personal computers based on an Intel microprocessor often have multiple buses, one of which can be an input/output (I/O) bus for the peripherals and one that directly connects the processor 105 and the memory 109 (often referred to as a memory bus). The buses are connected together through bridge components that perform any necessary translation due to differing bus protocols.

Network computers are another type of data processing system that can be used with the embodiments of the present invention. Network computers do not usually include a hard disk or other mass storage, and the executable programs are loaded from a network connection into the memory 109 for execution by the processor 105. A Web TV system, which is known in the art, is also considered to be a data processing system according to the embodiments of the present invention, but it may lack some of the features shown in FIG. 1, such as certain input or output devices. A typical data processing system will usually include at least a processor, memory, and a bus coupling the memory to the processor.

It will be apparent from this description that aspects of the present invention may be embodied, at least in part, in software. That is, the techniques may be carried out in a data processing system or other data processing system in response to its processor, such as a microprocessor, executing sequences of instructions contained in a memory, such as ROM, volatile RAM, non-volatile memory, cache, or a remote storage device.

In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the processing unit 105.

A machine readable medium can be used to store software and data which when executed by a data processing system causes the system to perform various methods of the present invention. This executable software and data may be stored in various places including for example ROM, volatile RAM, non-volatile memory, and/or cache. Portions of this software and/or data may be stored in any one of these storage devices.

Thus, a machine readable medium includes any mechanism that provides (i.e., stores and/or transmits) information in a form accessible by a machine (e.g., a computer, network device, cellular phone, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; and the like.

The methods of the present invention can be implemented using dedicated hardware (e.g., using Field Programmable Gate Arrays, or Application Specific Integrated Circuit) or shared circuitry (e.g., microprocessors or microcontrollers under control of program instructions stored in a machine readable medium. The methods of the present invention can also be implemented as computer instructions for execution on a data processing system, such as system 100 of FIG. 1.

Many of the methods of the present invention may be performed with a digital processing system, such as a conventional, general-purpose computer system. The computer systems may be, for example, entry-level Mac Mini® and consumer-level iMac® desktop models, the workstation-level Mac Pro® tower, and the MacBook® and MacBook Pro® laptop computers produced by Apple Inc., located in Cupertino, Calif. Small systems (e.g. very thin laptop computers) can benefit from the methods described herein. Special purpose computers, which are designed or programmed to perform only one function, or consumer electronic devices, such as a cellular telephone, may also perform the methods described herein.

Figure 2:
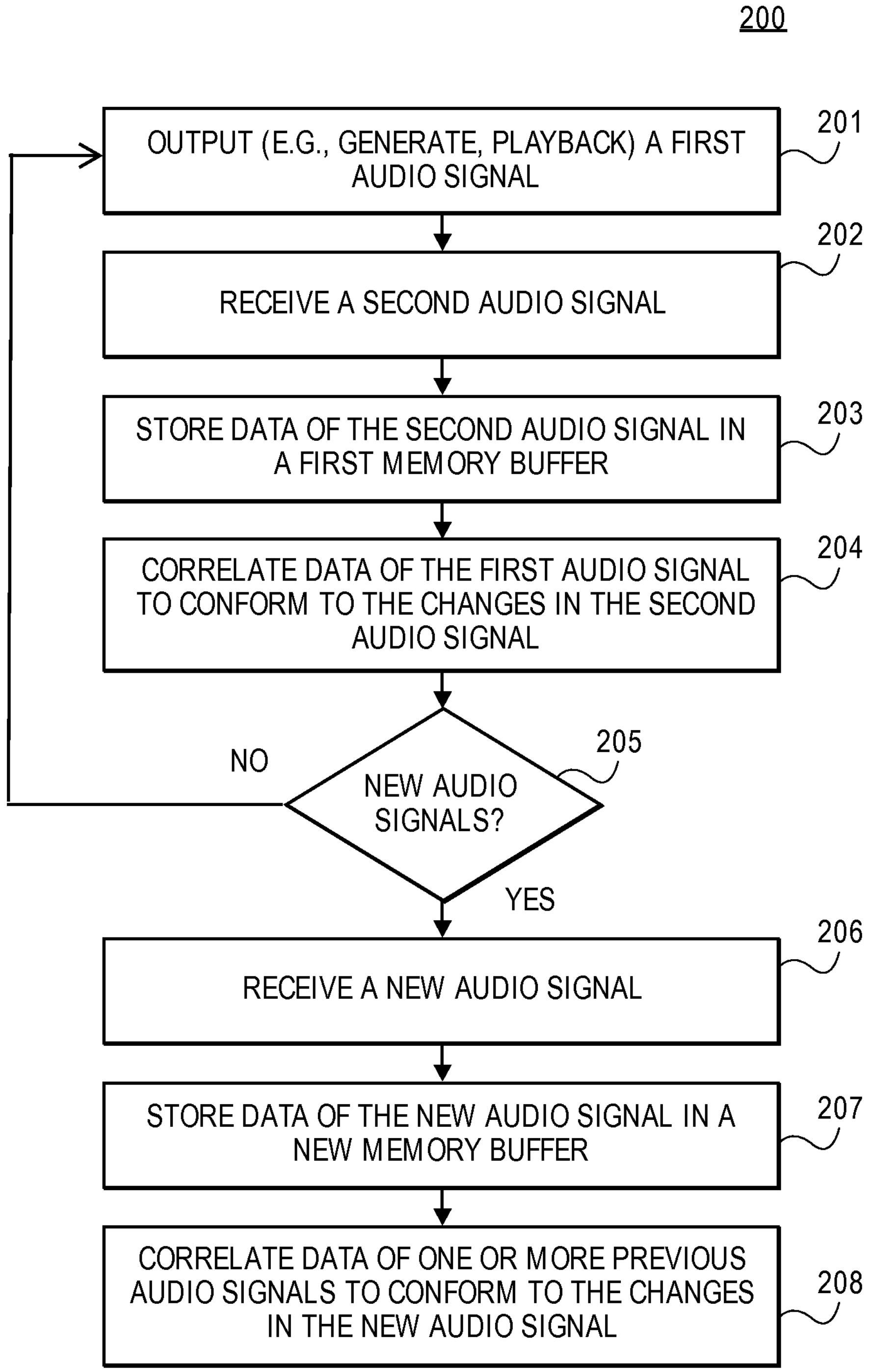
FIG. 2 is a flowchart of one embodiment of a method to correlate changes in audio signals.

FIG. 2 is a flowchart of one embodiment of a method 200 to correlate changes in audio signals. Method 200 begins with operation 201 that involves outputting a first audio signal. The audio signal may be, e.g., a piece of music, song, speech, or any other sound. In one embodiment, the first audio signal is an already recorded audio. In one embodiment, the first audio signal is outputted from a first memory buffer, such as one of the memory buffers of a memory 109.

In one embodiment, the outputting includes playing back the first audio signal in a loop. The length of the first audio signal, e.g., one or more number of musical measures, bars, or any time measure may determine the length of a loop. In another embodiment, the outputting includes generating (e.g., synthesizing) the first audio signal to play in the loop. The first audio signal may be outputted through, for example, audio output 123 depicted in FIG. 1.

At operation 202, a second audio signal is received. In one embodiment, the second audio signal has one or more tempo variances (changes) relative to the first audio signal. The tempo variances may cause pitch changes in the second audio signal relative to the first audio signal. The second audio signal may be received through, for example, audio input 125 depicted in FIG. 1. At operation 203, data of the received second audio signal are stored in a second memory buffer, such as another one of the memory buffers of memory 109.

At operation 204, the data of the first audio signal are correlated to conform to the changes in the second audio signal. In one embodiment, the data of the first audio signal are dynamically correlated to the data of the second audio signal while the second audio signal is received. In one embodiment, the tempo of the second audio signal changes continuously, and the first audio signal is dynamically correlated to the second audio signal to homogenize the speed at which playback is happening versus recording time and recording speed.

In one embodiment, correlating the data of the first audio signal to conform to the changes in the second audio signal includes adjusting a tempo of the first audio signal to the tempo of the second audio signal.

A portion (e.g., grain) of data of the first audio signal may be dynamically adjusted to match to the data of the second audio signal. For example, the portion of data of the first audio signal may be stretched in time ("time stretched"), compressed in time ("time compressed"), or both, to match to the data of the newly received second audio signal. That is, the data of the first audio signal are adjusted to the data of the second audio signal piecemeal based on the grains. In one embodiment, time-stretching and/or time-compressing of the portion of the data of the first audio signal to the portion of the data of the second audio signal is performed such that the first audio signal is relatively adjusted in pitch to the relative pitch changes in the second audio signal. In one embodiment, the size of the grain of data is the size of a musical time unit. The musical time unit may be, e.g., a beat, a portion of the beat, measure, bar, or any other musical time unit. The size of the grain of the audio data can be determined based on the tempo of the audio signal.

In one embodiment, the grain size of the audio data varies according to the tempo of the audio signal. The data of the first audio signal may be correlated by adjusting the size of the musical units to match to the size of the musical units associated with the second audio signal, as described in further detail below. In one embodiment, the relatively adjusted first audio signal is stored in a third memory buffer, such as yet another memory buffer of memory 109.

At operation 205 it is determined whether one or more new audio signals are received. If there are no more new audio signals received, method 200 returns to operation 201. If there are new audio signals, method 200 continues at operation 206 that involves receiving a new audio signal. The new audio signal may have one or more tempo variances (changes) relative to the one or more previously recorded audio signals. At operation 207 data of the new audio signal are stored in a new memory buffer, such as yet another memory buffer of memory 109.

At operation 208, the data of each of the one or more previously recorded audio signals are correlated to conform to the changes in the new audio signal, as described above with respect to operation 204. The correlated data of each of the previously recorded audio signals can be stored in the corresponding memory buffers. That is, instead of adapting new audio performance to what was already in the memory buffer the old performance already played in the loop is adjusted to the new performance that becomes a new master tempo until the next audio performance is received.

Figure 3:
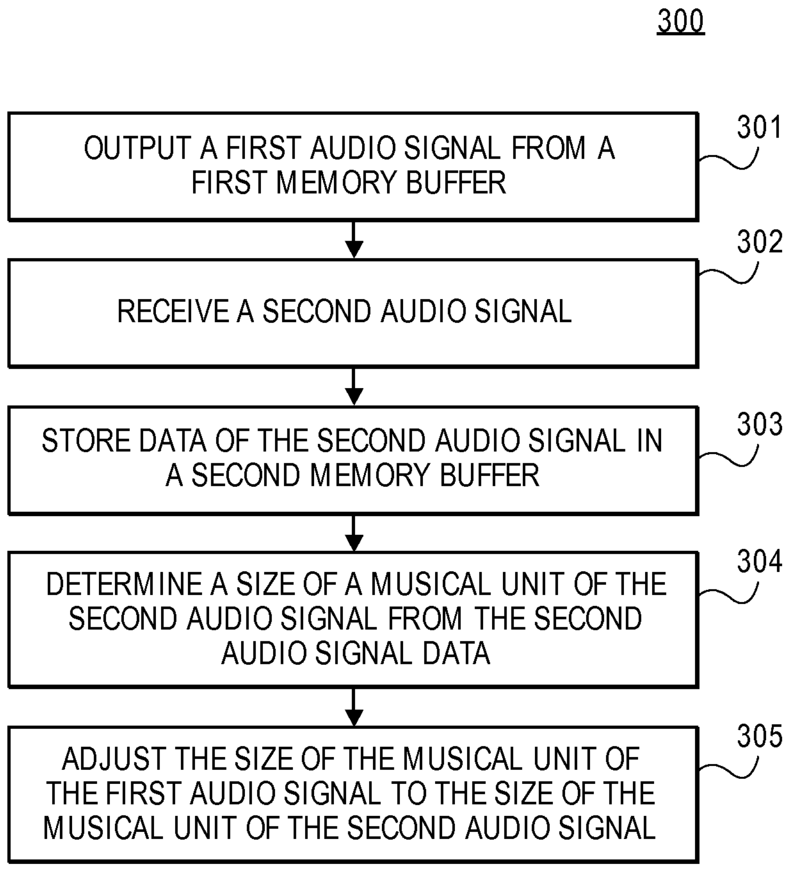
FIG. 3 is a flowchart of one embodiment of a method to adjust one audio signal to the changes in another audio signal.

FIG. 3 is a flowchart of one embodiment of a method 300 to adjust one audio signal to the changes in another audio signal. Method 300 begins at operation 301 that involves outputting a first audio signal from a first memory buffer. The first audio signal can be a previously recorded audio stored in the first memory buffer. The first audio signal may be played back in a loop. In one embodiment, the loop has a musical time ("length"). The length of the loop may be, for example, a number of musical measures and/or bars. Generally, for a piece of music, the number of beats is constant.

The time the loop is played back is determined by the tempo and the length of the loop. For example, if the length of the loop is 1 measure (8 beats), and the rate of the first audio signal's playback (tempo) is 120 beats per minute, the time the loop is played is 4 seconds. If the length of the loop is 1 measure (8 beats), and the rate of the first audio signal's playback (tempo) is 60 beats per minute, the time the loop is played is 8 seconds. At operation 302, a second audio signal is received. The second audio signal may include one or more tempo variances whereby the tempo variances cause relative pitch changes in the second audio signal. The data of the second audio signal are stored in a second memory buffer at operation 303, as set forth above.

At operation 304, a size of a musical unit associated the second audio signal may be determined. The musical time unit may be a beat, a portion of the beat, measure, bar, or any other musical time unit. In one embodiment, the size of the musical unit includes time. In one embodiment, the size of the musical unit is determined based on a tempo of the audio signal. For example, if the rate of the first audio signal's playback (tempo) is 120 beats per minute, the size ("length of time") of the beat associated with the first audio signal is 0.5 seconds. If the second audio signal is played at the tempo 60 beats per minute, the size of the beat associated with the second audio signal is 1 second. If the loop has the length of one measure, the loop is played 8 second.

At operation 305, the size of the musical unit of the first audio signal is adjusted to the size of the musical unit of the second audio signal. For example, the size of the beat of previously recorded audio signal is adjusted from 0.5 second to 1 second to match to the size of the beat of the newly received audio signal. Musically the tempo may be granular to the beat, so that the tempo of every beat of the previously recorded audio data can be instantaneously adjusted to the changing tempo of the newly received audio data.

That is, the size of the each beat of the previously recorded audio signal is adjusted dynamically to match with the size of the each beat of the currently received audio signal. Then, the grains of the audio data of the previously recorded audio signal can be time stretched/compressed based on the adjusted size of the each beat. The adjusted grains of audio data of the first audio signal and the audio data of the second audio signal are then mixed and output through an audio output device, as described below.

Figure 4:
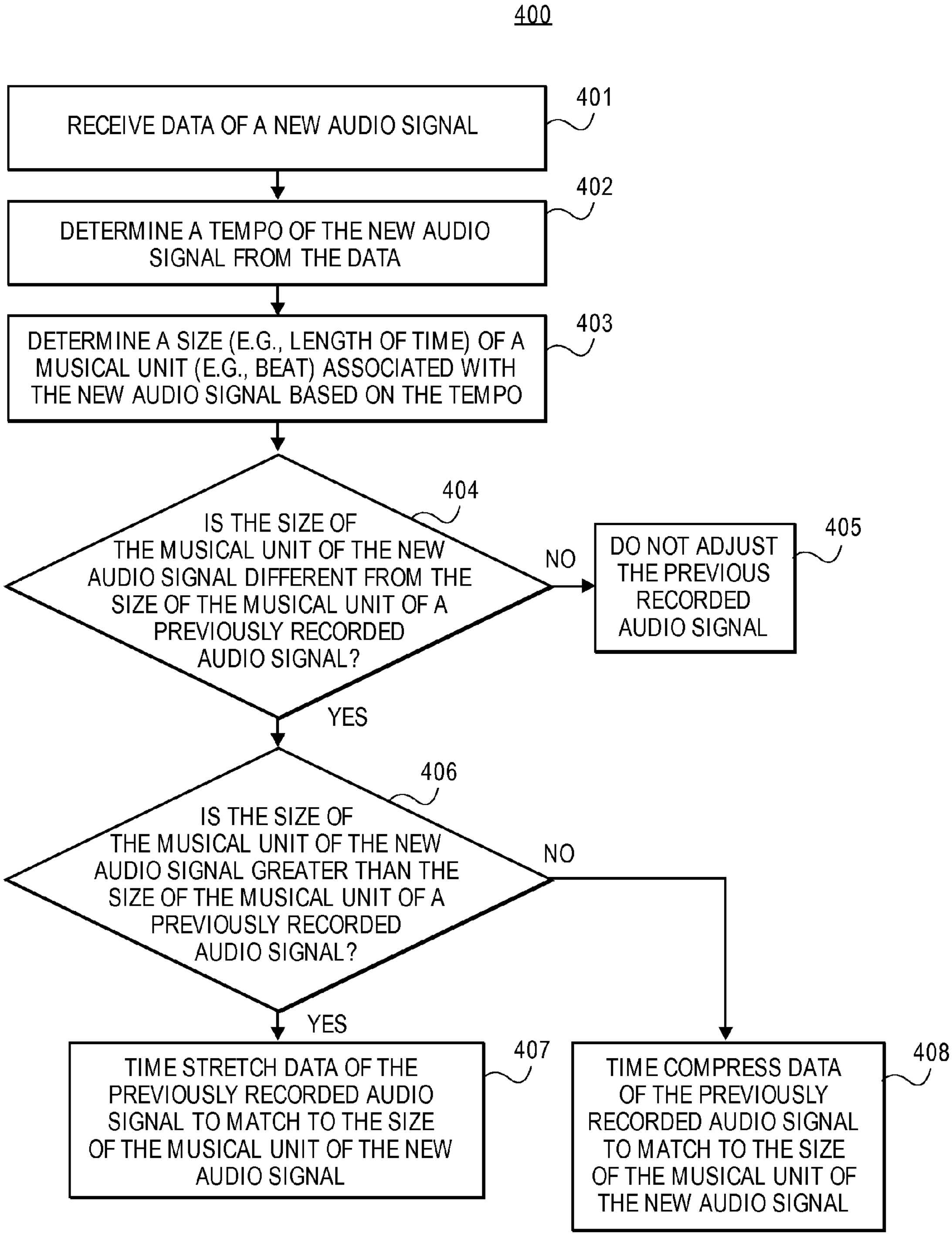
FIG. 4 is a flowchart of one embodiment of a method to adjust data of one audio signal to the data of another audio signal.

FIG. 4 is a flowchart of one embodiment of a method 400 to adjust data of one audio signal to the data of another audio signal. Method 400 begins with operation 401 that involves receiving data of a new audio signal, as described above. At operation 402, a tempo of the new audio signal is determined from the received data, as described below with respect to FIGS. 5 and 6.

At operation 403, the size of a musical unit associated with the new audio signal is determined based on the tempo. In one embodiment, the musical unit of the audio signal is a beat. The size may be a time length (duration) of the musical unit, for example, the duration of a beat. At operation 404, it is determined if the size of the musical unit of the new audio signal is different from the size of the musical unit of the previously recorded audio signal. If the size of the musical unit of the new audio signal is not different from the size of the musical unit of the previously recorded audio signal, the data of the previously recorded audio signal are not adjusted at operation 405.

If the size of the musical unit of the new audio signal is different from the size of the musical unit of the previously recorded audio signal, operation 406 is performed that involves determining whether the size of the musical unit of the new audio signal is greater than the size of the musical unit of the previously recorded audio signal. If the size of the musical unit of the new audio signal is greater than the size of the musical unit of the previously recorded audio signal, then at operation 407 a portion of the data of the previously recorded audio signal is time stretched to match to the size of the musical unit of the new audio signal.

If the size of the musical unit of the new audio signal is smaller than the size of the musical unit of the previously recorded audio signal, then at operation 408 a portion of the data of the previously recorded audio signal is time compressed to match to the size of the musical unit of the new audio signal. Time stretching and time compressing of the audio data may be performed using one of techniques known to one of ordinary skill in the art of audio processing.

Figure 5:
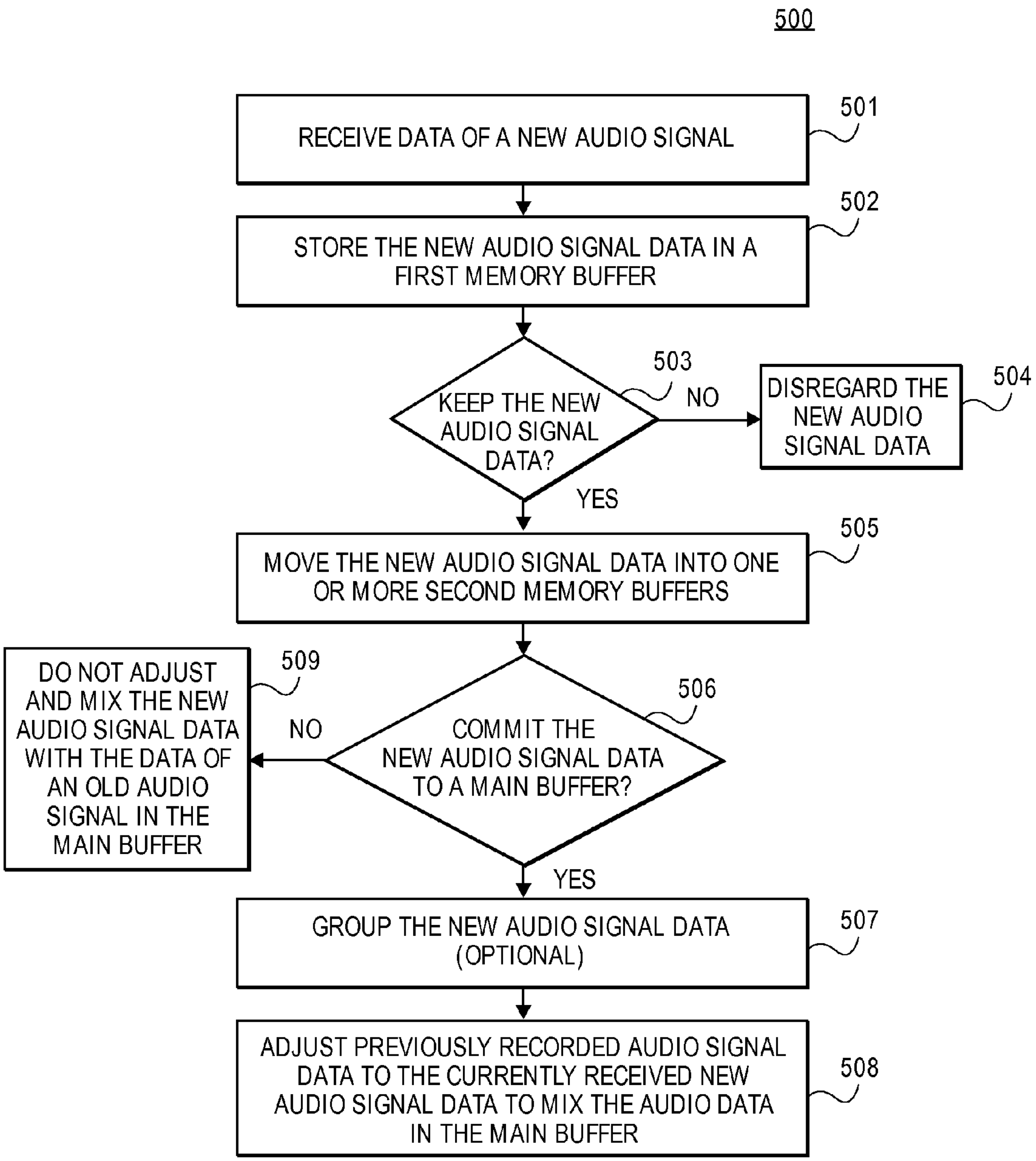
FIG. 5 is a flowchart of one embodiment of a method 500 to correlate data of one audio signal with the data of another audio signal.

FIG. 5 is a flowchart of one embodiment of a method 500 to correlate data of one audio signal with the data of another audio signal. Method 500 begins with operation 501 of receiving data of a new audio signal.

Figure 6:
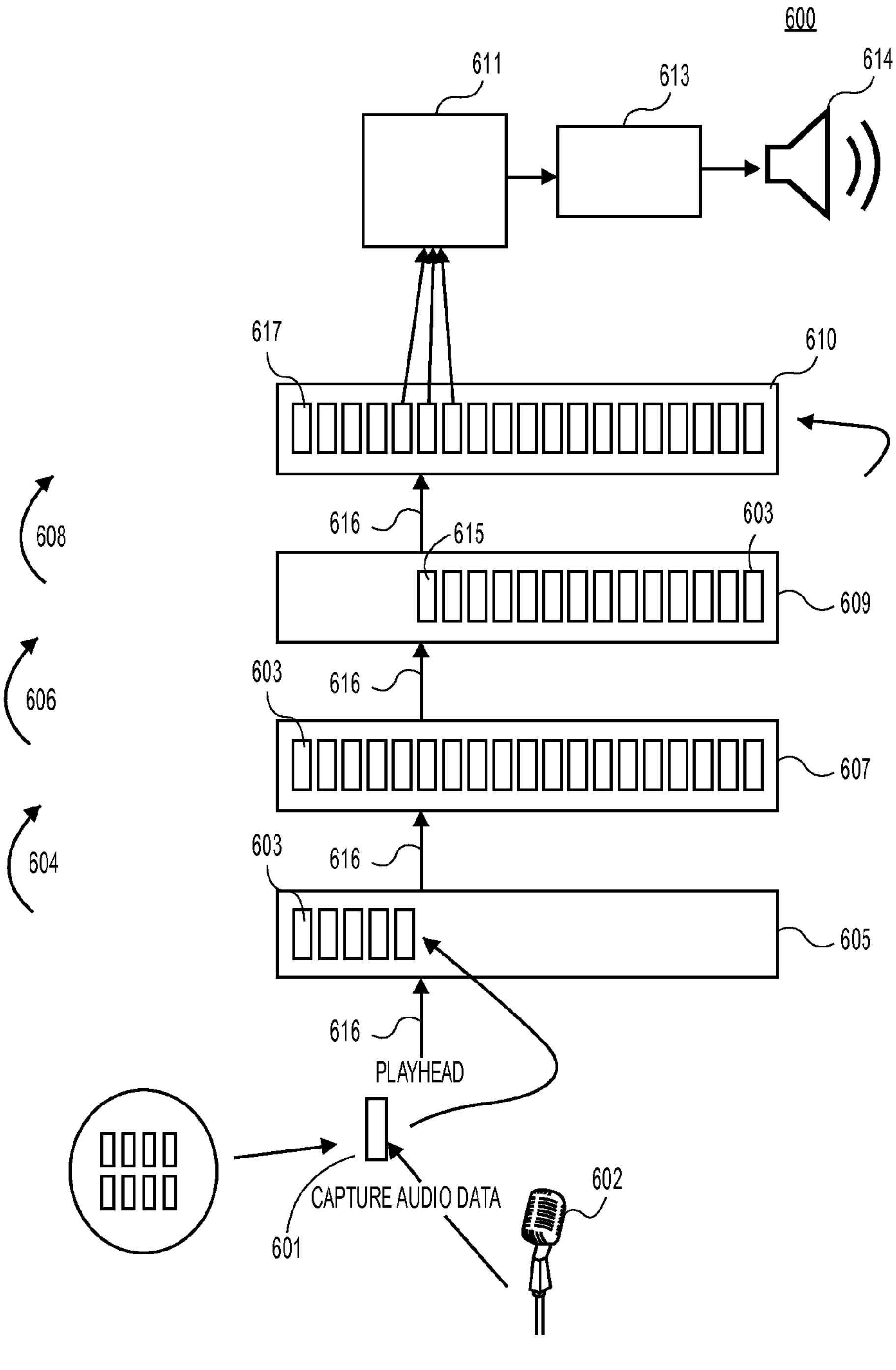
FIG. 6 illustrates one embodiment of a memory management process to correlate data of audio signals.

FIG. 6 illustrates one embodiment 600 of a memory management process to correlate data of audio signals. As shown in FIG. 6, an input device, e.g., a microphone 602 captures an audio signal 601 that contains audio signal data 603.

Referring back to FIG. 5, method 500 continues with operation 502 that involves storing the new audio signal in a first memory buffer. As shown in FIG. 6, audio signal data 603 are placed into a "Working Undo" memory buffer 605. Memory buffer 605 fills up with recording data of the audio signal.

In one embodiment, the memory buffer 605 does not playback. In one embodiment, the data of the audio signal do not output from memory buffer 605 to playback the audio signal.

Referring back to FIG. 5, at operation 503 it is determined whether to keep the new audio signal data. At operation 504 the new audio signal data are disregarded, if it is determined that the new audio signal data does not need to be kept. The audio signal data 603 may be removed from "Working Undo" memory buffer 605, e.g., discarded, or copied to another location in the memory, so that memory buffer 605 can store most recent audio data of subsequently captured new audio signals. That is, one or more "Working Undo" memory buffers allows to disregard the recorded audio data that are not needed. In one embodiment, the data processing system, such as system 101 does not have "Working Undo" buffers.

Referring back to FIG. 5, if it is determined that the new audio signal data need to be kept, the new audio signal data are moved into one or more second memory buffers at operation 505. As shown in FIG. 6, the new audio signal data 603 are moved 604 from memory buffer 604 into one or more memory buffers, such as "Full Undo" memory buffer 607. The data processing system, such as system 101 may include 1 to 20 of "Full Undo" memory buffers, such as memory buffer 607.

In one embodiment, each of the "Full Undo" memory buffers can be played back. There may be multiple speeds of playback of audio signals on each of the "Full Undo" memory buffers simultaneously. The audio data recorded into each of the "Full Undo" memory buffers may be time stretched and/or time compressed to play back at a correct synchronization and pitch when the tempo of the newly recorded audio signal changes. That is, previously recorded audio data from each of the "Full Undo" memory buffers can be time stretched and/or time compressed to playback while the most recently received audio data are kept substantially free of time stretching/time compressing.

Referring back to FIG. 5, at operation 506 it is determined whether to commit the new audio signal data 603 from one or more second memory buffers to a main buffer. At operation 509, if the one or more second memory buffers are not committed to the main buffer, the new audio signal data are not adjusted and being mixed with data of a previously recorded audio signal in a main buffer. Typically, mixing the audio data involves performing a mathematical operation on the audio data, e.g., "addition" of one audio data to another audio data.

As shown in FIG. 6, the new audio signal data 603 are moved 606 from "Full Undo" memory buffer 607 to a "Committing Undo" memory buffer 609. A portion (e.g., grain) 616 of the audio data 603 associated with a musical unit (e.g., a beat) may be tagged according to a position of a reference playhead 615 to determine a tempo of the audio signal 601. The position of the playhead 615 indicates the time position of the grain of the new audio signal data in the loop. The size of a musical unit associated with the new audio signal 601 is determined based on the tempo of the new audio signal 601.

Referring back to FIG. 5, if the new audio signal data are committed to the main buffer, an optional operation 507 can be performed that involves grouping the new audio signal data with one or more previously recorded audio signal data. The new audio signal data may be added to one or more previously recorded signal data to form a group of audio signals played back together from the main buffer. At operation 508 the previously recorded audio signal data are adjusted to the currently received new audio signal data 603 to mix the new and previously recorded audio signal data in the main buffer.

As shown in FIG. 6, audio signal data 603 are moved 608 to mix with audio data 617 of the previously recorded audio signal in a main buffer 610. The previously recorded audio data 617 are adjusted to conform to the new audio data 603.

That is, when the one or more "Full Undo" memory buffers are committed into the main buffer, the previously recorded data in the main buffer are dynamically adjusted to conform to the new recording's data tempo changes.

In one embodiment, the audio data of the previously recorded audio signal are time-stretched to match to the size of the musical unit associated with the data of the new audio signal 601, as set forth above. In another embodiment, the audio data of the previously recorded audio signal are time compressed to match to the size of the musical unit of the new audio signal 607.

As shown in FIG. 6, each musical unit (e.g., a beat) of the audio data from one or more memory buffers 607 committed to main buffer 610 is gathered at 611. Each of the previously recorded musical units of audio data is adjusted (time stretched, and/or time-compressed) at 613 to match to the size of the musical unit (e.g., a beat) of the audio data of newly received audio signal, such as signal 601. That is, the grains of the previously recorded audio data represented by the musical time unit are adjusted to the size of the most recent audio data to output from the main buffer. For example, each grain of the previously recorded audio data represented by the beat is adjusted to the size of the corresponding beat of the most recently received audio data to maintain the correct musical relationship to the master tempo that is set by the audio data of most recently received audio signal.

If the audio signal data are arranged in groups, each group of the audio data may be stored into a corresponding main memory buffer, such as buffer 610. For example, a group A of the audio data adjusted, as described above with respect to FIGS. 5 and 6, may be played back from a main memory buffer A (e.g., memory buffer 610), and another group B of the audio data adjusted, as described above with respect to FIGS. 5 and 6, may be played back from another main memory buffer B (not shown). In various embodiments, the groups of the adjusted audio data may or may not be mutually exclusive.

In one embodiment, audio data of the previously recorded audio signal are faded out after being adjusted to conform to the new recording's tempo. For example, the previously recorded audio signal may sound quieter and quieter as the play back in the loop proceeds further. After being adjusted and mixed, as described above, the audio data are outputted at 614, for example, through one or more speakers.

Figure 7:
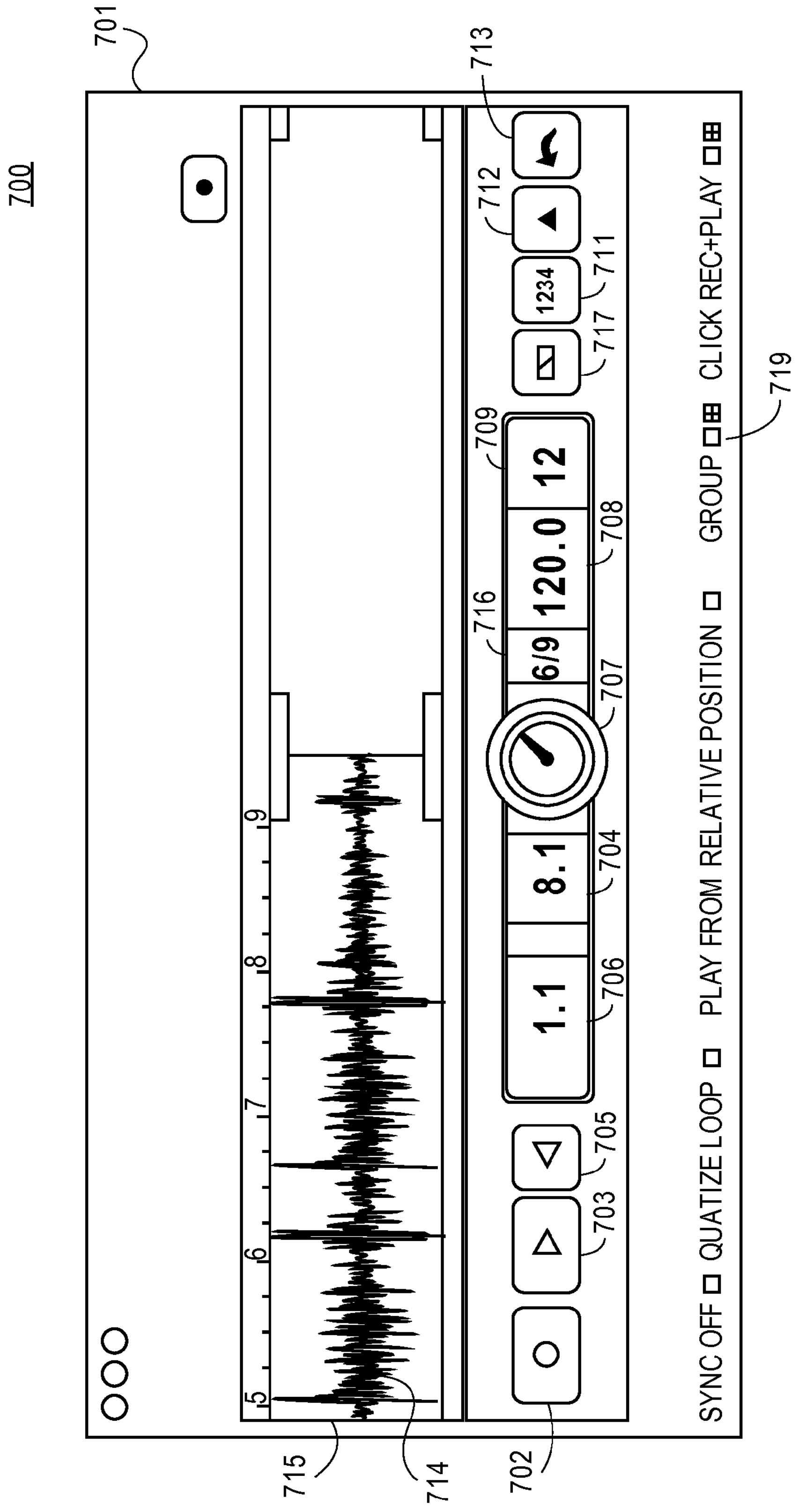
FIG. 7 is a view of one embodiment of a graphical user interface ("GUI") for recording new audio while playing back existing audio.

FIG. 7 is a view 700 of one embodiment of a graphical user interface ("GUI") 701 for recording new audio while playing back existing audio. GUI 701 includes a visual representation of a piece of analog tape 715 with recorded wave form 714. Backing tracks are represented as played back in a loop on tape 715 of a tape recorder, as shown in FIG. 7. The recorded wave form is displayed on a moving tape 715 during recording and playback. Tape 715 moves from right to left as played back in the loop. Newly recorded audio signals are added to the waveform 714 as the tape 715 moves.

The visual representation of tape 715 moves all the way to right, as recording of new audio data proceeds, new data appear on the tape together with the previously recorded old audio data. GUI 701 includes a "record" button 702, a "play" button 703, and a "reverse play" button 705. GUI 701 includes an indicator 706 indicating a current relative position of the recording audio along the loop. An indicator 704 indicates a total length of the loop. For example, the total length of the loop may be any number (e.g., from 1 to 8) of measures and/or bars. The total length of the loop may be set by the user. GUI 701 further includes a "clock" knob 707. At the beginning of the loop, the position of the knob 707 is at zero, and knob 707 moves around all the way back to zero like a little "clock" as the audio is played back one time in the loop.

GUI 701 has a ruler 716 with a time signature, a tempo indicator 708. The tempo may be set by a user, or may come from a master tempo. The master tempo may be determined, e.g., by most recently received audio. GUI 701 may include a "fade out" time indicator 709, and "fade out" button 717. If "fade out" button 717 is selected, the previously recorded audio data are faded out.

GUI 701 may include a turn "on/off" metronome button 711, "ahead of time" button 712, and "undo" button 713. User may select these buttons for recording the audio while playing back existing audio in the loop, as discussed above. Selecting buttons on the GUI is known to one of ordinary skill in the art of audio processing. "Record" button may be selected to start recording a new audio signal. For example, in response to a user's selection of "undo" button, newly recorded audio data can be discarded from "working undo" buffer 605, as described above with respect to FIGS. 5 and 6.

For example, in response to a user's selection of "fade out" button 717, the previously recorded audio that has been adjusted according to methods described above, is faded out using one of the techniques known to one of ordinary skill in the art of audio processing.

In one embodiment, GUI 701 includes a "group" button 719, to group the audio data together. The audio data of multiple audio signals selected to be in the same group are adjusted and mixed to be output from a corresponding main buffer, as described above.

In the foregoing specification, embodiments of the invention have been described with reference to specific exemplary embodiments thereof. It will be evident that various modifications may be made thereto without departing from the broader spirit and scope of the invention. The specification and drawings are, accordingly, to be regarded in an illustrative sense rather than a restrictive sense.

What is claimed is:

1. A machine-implemented method, comprising:

outputting a plurality of audio signals, wherein the plurality of audio signals are operable to be output at different speeds;

receiving a reference audio signal;

storing the reference audio signal in a first memory buffer;

correlating the plurality of audio signals to conform to the reference audio signal, wherein correlating includes time stretching or time compressing each of the plurality of audio signals, and wherein each of the plurality of audio signals is dynamically correlated to the reference audio signal while the reference audio signal is being received.

2. The machine-implemented method of claim 1, further comprising determining a size of a musical time unit of the reference audio signal.

3. The machine-implemented method of claim 1, wherein the correlating includes adjusting a tempo of the plurality of audio signals to the tempo of the reference audio signal.

4. The machine-implemented method of claim 1, further comprising:

receiving a second reference audio signal;

storing the second reference audio signal in a second memory buffer; and adjusting the reference audio signal to conform to the second reference audio signal, wherein the reference audio signal is dynamically correlated to the second reference audio signal while the second reference audio signal is being received.

5. The machine-implemented method of claim 1, further comprising:

determining whether to commit data of the reference audio signal to mix with the data of the plurality of audio signals.

6. A machine-implemented method to correlate audio signals, comprising:

receiving a new audio signal;

storing the new audio signal in a memory buffer;

determining a size of a musical unit of the new audio signal; and adjusting the size of the musical unit for each of a plurality of recorded audio signals to the size of the musical unit of the new audio signal, wherein the plurality of recorded audio signals are operable to be output at different speeds, wherein adjusting includes time stretching data or time compressing data for each of the plurality of recorded audio signals to match to the size of the musical unit of the new audio signal, and wherein each of the plurality of recorded audio signals is dynamically adjusted to the new audio signal while the new audio signal is being received.

7. The machine-implemented method of claim 6, wherein the size of the musical unit is determined based on a tempo of the new audio signal.

8. The machine-implemented method of claim 6, wherein the musical time unit includes a beat.

9. The machine-implemented method of claim 6, wherein the size of the musical unit includes time.

10. The machine-implemented method of claim 6, further comprising:

determining whether to commit data of the new audio signal to mix with the data of the plurality of recorded audio signals.

11. The machine-implemented method of claim 6, further comprising:

fading out the plurality of recorded audio signals.

12. A non-transitory machine-readable storage medium storing executable program instructions which when executed by a data processing system causes the system to perform operations, comprising:

outputting a plurality of audio signals, wherein the plurality of audio signals are operable to be output at different speeds;

receiving a reference audio signal;

storing the reference audio signal in a first memory buffer; and correlating the plurality of audio signals to conform to the reference audio signal, wherein correlating includes time stretching or time compressing the plurality of audio signals, and wherein each of the plurality of audio signals is dynamically correlated to the reference audio signal while the reference audio signal is being received.

13. The non-transitory machine-readable storage medium of claim 12, further comprising instructions that cause the system to perform operations comprising:

determining a size of a musical time unit of the reference audio signal.

14. The non-transitory machine-readable storage medium of claim 12, wherein correlating includes:

adjusting a tempo of the plurality of audio signals to the tempo of the reference audio signal.

15. The non-transitory machine-readable storage medium of claim 12, further comprising instructions that cause the system to perform operations comprising:

receiving a second reference audio signal;

storing the second reference audio signal in a second memory buffer; and correlating the reference audio signal to conform to the second reference audio signal, wherein the reference audio signal is dynamically correlated to the second reference audio signal while the second reference audio signal is being received.

16. The non-transitory machine-readable storage medium of claim 12, further comprising instructions that cause the system to perform operations comprising:

determining whether to commit data of the reference audio signal to mix with the data of the plurality of audio signals.

17. A non-transitory machine-readable storage medium storing executable program instructions which when executed by a data processing system causes the system to perform operations, comprising:

receiving a new audio signal;

storing the new audio signal in a memory buffer;

determining a size of a musical unit of the new audio signal; and adjusting the size of the musical unit for each of a plurality of recorded audio signals to the size of the musical unit of the new audio signal, wherein the plurality of recorded audio signals are operable to be output at different speeds, wherein adjusting includes time stretching data or time compressing data for each of the plurality of recorded audio signals to match to the size of the musical unit of the new audio signal, and wherein each of the plurality of recorded audio signals is dynamically adjusted to the new audio signal while the new audio signal is being received.

18. The non-transitory machine-readable storage medium of claim 17, further comprising instructions that cause the system to perform operations comprising:

tagging the musical unit of the new audio signal.

19. The non-transitory machine-readable storage medium of claim 17, wherein the size of the musical unit is determined based on a tempo of the new audio signal.

20. The non-transitory machine-readable storage medium of claim 17, wherein the musical time unit includes a beat.

21. The non-transitory machine-readable storage medium of claim 17, wherein the size of the musical unit includes time.

22. The non-transitory machine-readable storage medium of claim 17, further comprising instructions that cause the system to perform operations comprising:

determining whether to commit data of the new audio signal to mix with the data of the plurality of recorded audio signals.

23. The non-transitory machine-readable storage medium of claim 17, further comprising instructions that cause the system to perform operations comprising:

fading out the plurality of recorded audio signals.

24. A data processing system, comprising:

a first memory buffer; and a processor coupled to the first memory buffer, wherein the processor is configured to:

output a plurality of audio signals, wherein the plurality of audio signals are operable to be output at different speeds;

receive a reference audio signal;

store the reference audio signal in the first memory buffer; and correlate the plurality of audio signals to conform to the reference audio signal, wherein correlating includes time stretching or time compressing each of the plurality of audio signals, and wherein each of the plurality of audio signals is dynamically correlated to the second reference audio signal while the second reference audio signal is being received.

25. The data processing system of claim 24 wherein the processor is further configured to determine a size of a musical time unit of the reference audio signal.

26. The data processing system of claim 24, wherein the correlating includes adjusting a tempo for each of the plurality of audio signals to the tempo of the reference audio signal.

27. The data processing system of claim 24, wherein the processor is further configured to:

receive a second reference audio signal;

store the second reference audio signal in a second memory buffer; and correlate the reference audio signal to conform to the second reference audio signal, wherein the reference audio signal is dynamically correlated to the second reference audio signal while the second reference audio signal is being received.

28. The data processing system of claim 24, wherein the processor is further configured to determine whether to commit data of the reference audio signal to mix with the data of the plurality of audio signals.

29. A data processing system to correlate audio signals, comprising:

a memory buffer; and a processor coupled to the memory buffer, wherein the processor is configured to:

receive a new audio signal;

store the new audio signal in the memory buffer;

determine a size of a musical unit of the new audio signal; and adjust the size of the musical unit of a recorded plurality of audio signals to the size of the musical unit of the new audio signal, wherein the recorded plurality of audio signals are operable to be output at different speeds, wherein adjusting includes time stretching data or time compressing data of the recorded plurality of audio signals to match to the size of the musical unit of the new audio signal, and wherein each of the recorded plurality of audio signals is dynamically adjusted to the new audio signal while the new audio signal is being received.

30. The data processing system of claim 29, wherein the processor is further configured to tag the musical unit of the new audio signal.

31. The data processing system of claim 29, wherein the size of the musical unit is determined based on a tempo of the new audio signal.

32. The data processing system of claim 29, wherein the musical time unit includes a beat.

33. The data processing system of claim 29, wherein the size of the musical unit includes time.

34. The data processing system of claim 29, wherein the processor is further configured to determine whether to commit data of the new audio signal to mix with the data of the recorded plurality of audio signals.

35. The data processing system of claim 29, wherein the processor is further configured to fade out the recorded plurality of audio signals.

36. A data processing system, comprising:

means for outputting a plurality of audio signals, wherein the plurality of audio signals are operable to be output at different speeds;

means for receiving a reference audio signal;

means for storing the reference audio signal in a first memory buffer; and means for correlating the plurality of audio signals to conform to the reference audio signal, wherein correlating includes time stretching or time compressing the plurality of audio signals, and wherein each of the plurality of audio signals is dynamically correlated to the reference audio signal while the reference audio signal is being received.

37. The data processing system of claim 36, further comprising:

means for receiving a second reference audio signal;

means for storing the second reference audio signal in a second memory buffer; and means for correlating the reference audio signal to conform to the second reference audio signal, wherein the reference audio signal is dynamically correlated to the second reference audio signal while the second reference audio signal is being received.

38. The data processing system of claim 36, further comprising:

means for determining whether to commit data of the reference audio signal to mix with the data of the plurality of audio signals.

39. A data processing system to correlate audio signals, comprising:

means for receiving a new audio signal;

means for storing the new audio signal in a memory buffer;

means for determining a size of a musical unit of the new audio signal; and means for adjusting the size of the musical unit of a recorded plurality of audio signals to the size of the musical unit of the new audio signal, wherein the recorded plurality of audio signals are operable to be output at different speeds, wherein adjusting includes time stretching data or time compressing data of the recorded plurality of audio signals to match to the size of the musical unit of the new audio signal, and wherein each of the recorded plurality of audio signals is dynamically adjusted to the new audio signal while the new audio signal is being received.

40. The data processing system of claim 39, further comprising:

means for determining whether to commit data of the new audio signal to mix with the data of the recorded plurality of audio signals.

41. The data processing system of claim 39, further comprising:

means for fading out the recorded plurality of audio signals.

* * * * *

UNITED STATES PATENT AND TRADEMARK OFFICE

CERTIFICATE OF CORRECTION

PATENT NO. : 8,655,466 B2
APPLICATION NO. : 12/544141
DATED : February 18, 2014
INVENTOR(S) : Moulios It is certified that error appears in the above-identified patent and that said Letters Patent is hereby corrected as shown below:

In the Claims

Column 12, Line 45, Claim 1: please insert --and-- before the word correlating.

Column 13, Line 53, Claim 12: please delete "being".

Column 15, Line 2, Claim 24: please delete "second".

Column 15, Line 3, Claim 24: please delete "second".

Signed and Sealed this
Twenty-seventh Day of May, 2014

Michelle K. Lee

Michelle K. Lee
*Deputy Director of the United States Patent and Trademark Office*